United States Patent
Ali et al.

(10) Patent No.: US 9,154,133 B2
(45) Date of Patent: Oct. 6, 2015

(54) ESD ROBUST LEVEL SHIFTER

(71) Applicant: Texas Instruments Incorporated, Dallas, TX (US)

(72) Inventors: Muhammad Yusuf Ali, Irving, TX (US); Rajkumar Sankaralingam, Plano, TX (US); Charles M. Branch, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 188 days.

(21) Appl. No.: 13/630,721

(22) Filed: Sep. 28, 2012

(65) Prior Publication Data

US 2013/0077196 A1  Mar. 28, 2013

Related U.S. Application Data

(60) Provisional application No. 61/540,080, filed on Sep. 28, 2011.

(51) Int. Cl.
*H03H 9/46* (2006.01)
*H03K 19/003* (2006.01)
*H02H 9/04* (2006.01)
*H01L 27/02* (2006.01)

(52) U.S. Cl.
CPC .......... *H03K 19/00384* (2013.01); *H02H 9/046* (2013.01); *H01L 27/0266* (2013.01)

(58) Field of Classification Search
USPC .......... 361/56, 212, 220; 630/56; 326/62–63, 326/68, 80–83, 86, 87; 327/333
See application file for complete search history.

(56) References Cited

U.S. PATENT DOCUMENTS

| | | | | |
|---|---|---|---|---|
| 5,886,558 A * | 3/1999 | Iijima et al. | | 327/310 |
| 5,892,371 A * | 4/1999 | Maley | | 326/81 |
| 6,034,549 A * | 3/2000 | Matsumoto et al. | | 326/68 |
| 6,034,854 A * | 3/2000 | Suga | | 361/56 |
| 6,147,540 A * | 11/2000 | Coddington | | 327/333 |
| 7,554,361 B2 * | 6/2009 | Kim et al. | | 326/81 |
| 7,560,971 B2 * | 7/2009 | Heikkila et al. | | 327/333 |
| 7,782,113 B2 * | 8/2010 | Lin | | 327/333 |
| 8,344,456 B2 * | 1/2013 | Arakawa et al. | | 257/355 |
| 2001/0028258 A1 * | 10/2001 | Jeon | | 326/98 |
| 2005/0286187 A1 * | 12/2005 | Liu et al. | | 361/56 |
| 2006/0114047 A1 * | 6/2006 | Irino | | 327/328 |
| 2007/0014061 A1 * | 1/2007 | Chang et al. | | 361/56 |
| 2007/0182444 A1 * | 8/2007 | Tanaka et al. | | 326/21 |
| 2010/0102392 A1 * | 4/2010 | Arakawa et al. | | 257/355 |

* cited by examiner

*Primary Examiner* — Thienvu Tran
*Assistant Examiner* — Angela Brooks
(74) *Attorney, Agent, or Firm* — John Pessetto; Frank D. Cimino

(57) ABSTRACT

An inverter type level shifter includes a first power supply voltage and a first ground voltage. A first inverter operates on the first power supply voltage and the first ground voltage to generate a first inverter output. The first inverter includes a first PMOS transistor having a drain coupled to a source of a blocking PMOS transistor and a first NMOS transistor having a drain coupled to a source of a blocking NMOS transistor. The level shifter further includes a second power supply voltage and a second ground voltage, and a second inverter coupled to the first inverter output and operates on the second power supply voltage and the second ground voltage. The blocking PMOS provides the required blocking on the event of the voltage spike in the second power supply voltage w.r.t the first power supply voltage and the blocking NMOS transistor provides the required blocking on the event of the voltage spike in the second ground voltage with respect to the first ground voltage.

12 Claims, 2 Drawing Sheets

ESD ROBUST LEVEL SHIFTER

CROSS REFERENCE TO RELATED APPLICATIONS

This application claims the benefit of provisional patent application No. 61/540,080, filed on Sep. 28, 2011, in the United States Patent And Trademarks Office, which is incorporated herein by reference in its entirety.

TECHNICAL FIELD

Embodiments of the disclosure relate to a level shifter with electro-static discharge (ESD) protection.

BACKGROUND

Advancements in Integrated Circuit (IC) technology has led to smaller and more fragile active devices with thinner gate oxide layers to achieve higher operation speed and lower power consumption. With aggressive scaling down of the transistor size, the electrostatic discharge (ESD) has not scaled down with CMOS technology, and thus ESD protection design in nanoscale CMOS processes becomes a challenging task. Due to the large number of transistors placed on an IC, the technology is driven by the need to reduce power consumption and maintain high reliability.

In a system on chip (SoC) design, different blocks such as digital and analog are fabricated onto a single IC, and hence requires different voltages to achieve reduced power consumption and optimum performance. As a result, a level shifter is widely used to convert a logic signal from one voltage level to another voltage level. Therefore, in multi domain high speed applications (like USB 3.0, Thunder Bolt etc), ESD protection in a level shifter at the domain interface is very crucial and imposes several challenges due to low oxide breakdown voltage. Existing level shifter designs are susceptible to ESD failures in advanced CMOS nodes and hence there is a need for a level shifter with improved ESD protection without compromising on the robustness.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides an inverter type level shifter with multi-ground voltage domain. The level shifter includes a first power supply voltage and a first ground voltage. A first inverter operates on the first power supply voltage and the first ground voltage to generate a first inverter output, in response to an input signal. The first inverter includes a first PMOS transistor having a drain coupled to a source of a blocking PMOS transistor, and a first NMOS transistor having a drain coupled to a source of a blocking NMOS transistor. A drain of the blocking NMOS transistor and a drain of the blocking PMOS transistor are interconnected to generate the first inverter output. The inverter type level shifter further includes a second power supply voltage, a second ground voltage, and a second inverter. The second inverter is coupled to the first inverter output and operates on the second power supply voltage and the second ground voltage; to generate an output signal. On an event of a voltage spike in the second power supply domain with respect to the first power supply domain, the blocking PMOS provides the required blocking (additional voltage drop in the path) and thus increase the damage threshold of the gate oxide of the PMOS in the second inverter. On an event of a voltage spike in the second ground domain with respect to the first ground domain, the blocking NMOS provides the required blocking (additional voltage drop in the path) and thus increase the damage threshold of the gate oxide of an NMOS transistor in the second inverter. Thus the blocking PMOS and blocking NMOS transistors increase the electro-static discharge (ESD) robustness to the second inverter.

Another example embodiment provides an inverter type level shifter with single-ground voltage domain. The level shifter includes a first power supply voltage, a second power supply voltage and a ground voltage. A first inverter operates on the first power supply voltage and the ground voltage to generate a first inverter output, in response to an input signal. The first inverter includes a first PMOS transistor having a drain coupled to a source of a blocking PMOS transistor, and a first NMOS transistor. The first NMOS transistor having a drain interconnected with a drain of the blocking PMOS transistor to generate the first inverter output. The level shifter further includes a second inverter coupled to the first inverter output. The second inverter operates on the second power supply voltage and the ground voltage; to generate an output signal. On an event of a voltage spike in the second power supply domain with respect to the first power supply domain, the blocking PMOS provides the required blocking (additional voltage drop in the path) and thus increase the damage threshold of the gate oxide of a PMOS transistor in the second inverter to increase electro-static discharge (ESD) protection robustness to the second inverter.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
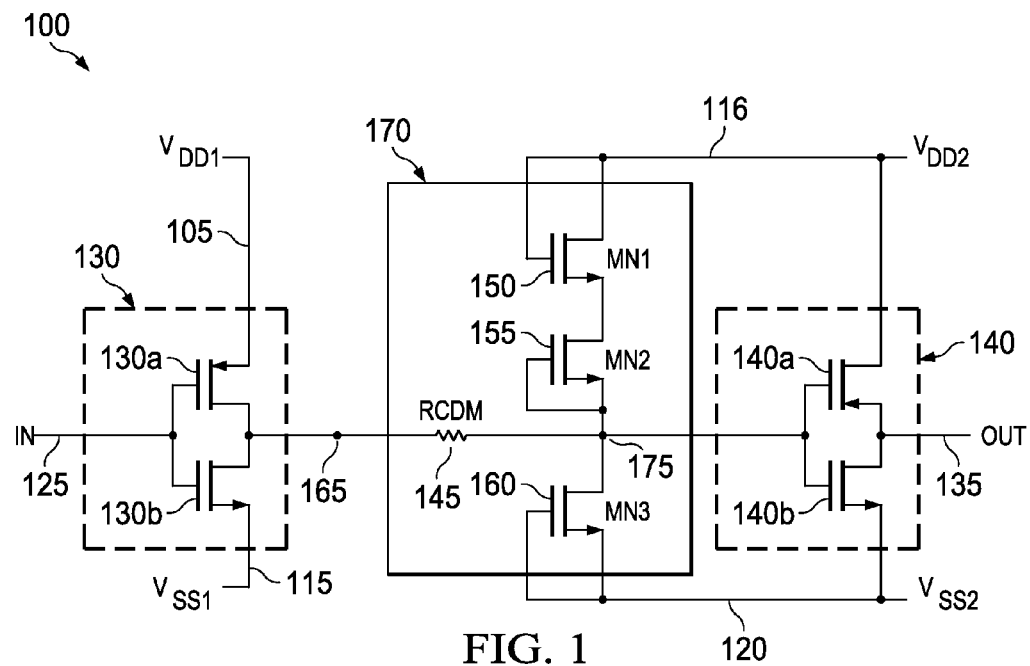
FIG. 1 illustrates a circuit diagram of an inverter type level shifter.

FIG. 1 illustrates a transistor level circuit diagram of an inverter type level shifter 100. The level shifter 100 receives a first power supply voltage (VDD1) 105 and a first ground voltage (VSS1) 115. A first inverter 130 receives an input signal 125 and operates on the first power supply voltage 105 and the first ground voltage 115; to generate a first inverter output 165. The first inverter 130 includes a first PMOS transistor 130a having a drain coupled to a drain of a first NMOS transistors 130b. An ESD protection circuit 170 is coupled to the first inverter output 165 and operates on a second power supply voltage (VDD2) 110 and second ground voltage (VSS2) 120. The ESD protection circuit 170 includes a resistor (Rcdm) 145, a primary NMOS transistor 150 having a source coupled to a drain of a secondary NMOS transistor 155, and a tertiary NMOS transistor 160 whose drain is short circuited with the source of the secondary NMOS transistor 155 to generate an output of the ESD protection circuit 170.

The gates of the secondary NMOS transistor 155 and tertiary NMOS transistor 160 are connected to the source terminal of the respective transistors (155 and 160). The gate and drain of the primary NMOS transistor 150 receive the second power supply voltage (VDD2) 110 and the source of the tertiary NMOS transistor 160 is connected to the second ground voltage (VSS2) 120. The level shifter 100 also includes a second inverter 140 that operates on the second power supply (VDD2) 110 and the second ground voltage (VSS2) 120 to generate an output signal 135. The second inverter 140 includes a second PMOS transistor 140a having a gate coupled to a gate of a second NMOS transistor 140b. The second inverter 140 receives the output of the ESD protection circuit 170 at the gate terminals of the second PMOS transistor 140a and second NMOS transistor 140b. The drains of the second PMOS transistor 140a and the second NMOS transistor 140b are short circuited to generate the output signal 135.

The operation of the level shifter 100 in FIG. 1 is explained now. The ESD protection circuit 170 is responsible for protecting the first inverter 130 and the second inverter 140 on an event of an ESD pulse. An ESD pulse effectively results in a sudden rise and fall in the voltage seen in either any one of first power supply voltage 105 and second power supply voltage 110 and first ground voltage 115 and second ground voltage 120. For example, if the input signal 125 is logic '0' then the first PMOS transistor 130a will be turned on, and as a result (VDD1) 105 is passed to the first inverter output 165. Now, consider a situation when there is a voltage spike in the second power supply voltage (VDD2) 110. This voltage spike results in the transmission of the second power supply voltage (VDD2) 110 through the second PMOS transistor 140a to the node 175. In the conventional protection scheme, the high side clamp MN1 and MN2 along with the resistor (Rcdm) 145 protects the gate oxide of the PMOS transistor (140a) in the second inverter. In high speed applications (like USB 3.0, Thunder Bolt etc) to ensure ESD protection in the level shifter 100, the resistor (Rcdm) 145 must be of very high value. Due to the high resistance value, the resistor 145 is undesirable in high speed designs as it results in loss of functionality of the IC. Further, ESD protection in the level shifter 100 at the domain interface is very challenging due to low oxide breakdown voltage. The level shifter 100 design has poor robustness as large resistance values are required for the resistor Rcdm 145 and this makes level shifter 100 susceptible to ESD failures in advanced CMOS nodes.

Figure 2:
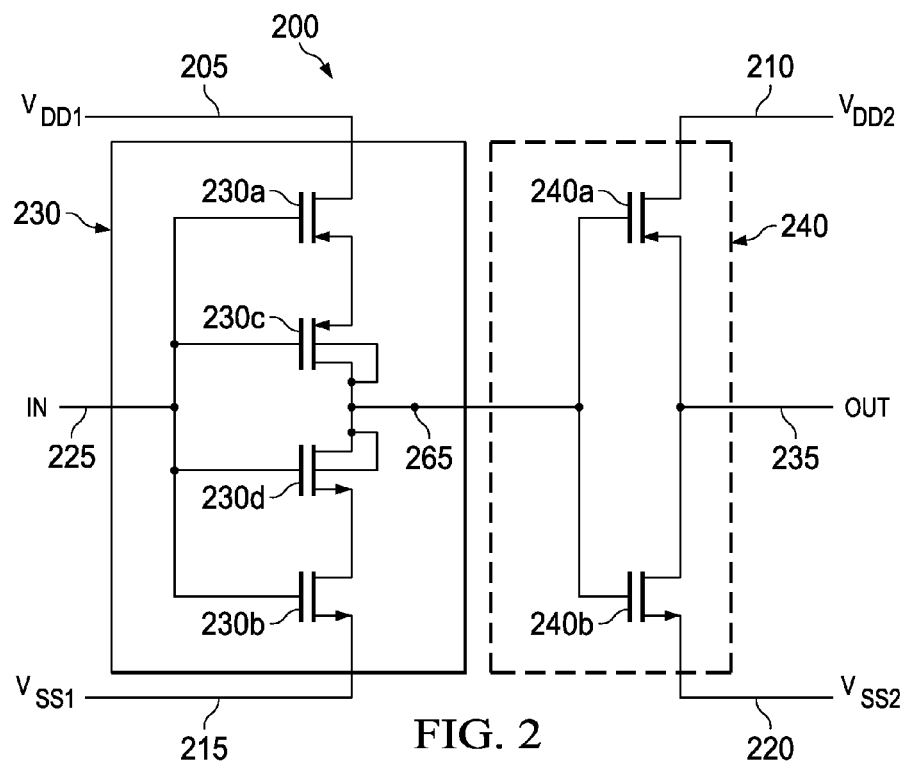
FIG. 2 illustrates a circuit diagram of an inverter type level shifter with multi-ground voltage domain, according to an embodiment.

FIG. 2 illustrates a transistor level circuit diagram of an inverter type level shifter 200 with multi-ground voltage domain, according to an embodiment. The level shifter 200 includes a first power supply voltage (VDD1) 205 and a first ground voltage (VSS1) 215. A first inverter 230 operates on the first power supply voltage (VDD1) 205 and the first ground voltage (VSS1) 215 to generate a first inverter output 265, in response to an input signal 225. The first inverter 230 includes a first PMOS transistor 230a having a drain coupled to a source of a blocking PMOS transistor 230c, and a first NMOS transistor 230b having a drain coupled to a source of a blocking NMOS transistor 230d. A bulk terminal of the blocking PMOS transistor 230c is connected to the drain of the blocking PMOS transistor 230c and a gate of the blocking PMOS transistor 230c receives the input signal 225. Similarly, a bulk terminal of the blocking NMOS transistor 230d is connected to the drain of the blocking NMOS transistor 230d and a gate of the blocking NMOS transistor 230d receive the input signal 225. A drain of the blocking NMOS transistor 230d and a drain of the blocking PMOS transistor 230c are interconnected to generate the first inverter output 265. The gates of the first PMOS transistor 230a and the first NMOS transistor 230b also receive the input signal 225. The inverter type level shifter 200 further includes a second power supply voltage (VDD2) 210 and a second ground voltage (VSS2) 220, and a second inverter 240. The second inverter 240 includes a second PMOS transistor 240a having a gate coupled to a gate of a second NMOS transistor 240b. The second inverter 240 is coupled to the first inverter output 265 and operates on the second power supply voltage (VDD2) 210 and the second ground voltage (VSS2) 220; to generate an output signal 235.

The operation of the level shifter 200 in FIG. 2 is now explained. The level shifter 200 receives the input signal 225 to generate the output signal 235 with a voltage level according to the level of the input signal 225. The input signal operates between the first power supply voltage (VDD1) 205 and the first ground voltage (VSS1) 215, and the output signal 235 operates between the second power supply voltage (VDD2) 210 and the second ground voltage (VSS2) 220. Consider a situation when the input signal 225 is logic '0'. The first PMOS transistor 230a and the blocking PMOS transistor 230c pass the first power supply voltage (VDD1) 205 to the first inverter output 265. If the first power supply voltage (VDD1) 205 is lesser in value compared to the second power supply voltage (VDD2) 210, then the second power supply voltage (VDD2) 210 is passed as the output signal 235. If the first power supply voltage (VDD1) 205 is greater in value compared to the second power supply voltage (VDD2) 210 then the second ground voltage (VSS2) 220 is passed as the output signal 235. Therefore the voltage level of the output signal 235 depends on the input signal 225.

An ESD pulse effectively results in a sudden rise and fall in the voltage seen in either any one of first power supply voltage 205, second power supply voltage 210, first ground voltage 215 and second ground voltage 220. Consider a situation when there is a voltage spike in the second power supply voltage (VDD2) 210. This voltage spike results in the transmission of the second power supply voltage (VDD2) 210 through the second PMOS transistor 240a to the first inverter output 265. Following the voltage spike, the blocking PMOS (230c) provides the required blocking (additional voltage drop in the path) and thus increase the damage threshold of the gate oxide of the PMOS transistor (240a) in the second inverter. Similarly, when there is a voltage spike in the second ground voltage (VSS2) 220, any voltage level on the first inverter output 265 will effectively act like a logic '1' thereby turning on the second NMOS transistor 240b and passing the second ground voltage (VSS2) 220. Following the voltage spike in the second ground voltage 220 with respect to the first ground domain, the blocking NMOS (230d) provides the required blocking (additional voltage drop in the path) and thus increase the damage threshold of the gate oxide of the NMOS in the second inverter. Thus the blocking PMOS (230c) and blocking NMOS (230d) transistors increase the electro-static discharge (ESD) robustness to the second inverter. The level shifter 200 does not require high resistance clamps or resistors (Rcdm) 145 to protect the transistors 240a and 240b. The high resistance clamps or resistor (Rcdm) 145 are not desirable in high speed applications (like USB 3.0, Thunder Bolt etc) as it adversely affects the robustness of the circuit. With the level shifter 200 there is no loss of functionality of the IC as in the proposed solution the blocking transistors 230c and 230d provide the required blocking in a very small area.

Figure 3:
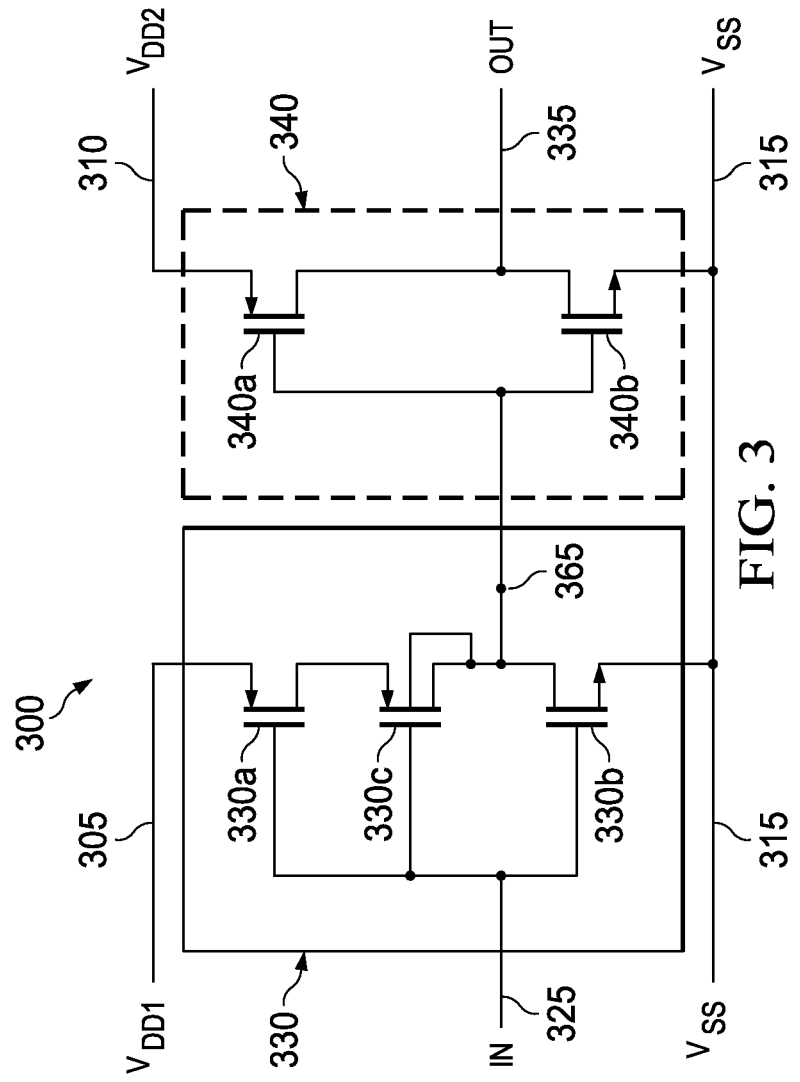
FIG. 3 illustrates a circuit diagram of an inverter type level shifter with single-ground voltage domain according to an embodiment.

FIG. 3 illustrates a transistor level circuit diagram of an inverter type level shifter 300 with single-ground voltage domain according to an embodiment. The level shifter 300 includes a first power supply voltage (VDD1) 305, a second power supply voltage (VDD2) 310 and a ground voltage (VSS) 315. A first inverter 330 operates on the first power supply voltage (VDD1) 305 and the ground voltage (VSS) 315 to generate a first inverter output 365, in response to an input signal 325. The first inverter 330 includes a first PMOS transistor 330a, having a drain coupled to a source of a blocking PMOS transistor 330c, and a first NMOS transistor 330b. A bulk terminal of the blocking PMOS transistor 330c is connected to the drain of the blocking PMOS transistor 330c and a gate of the blocking PMOS transistor 330c receives the input signal 325. The gates of the first PMOS transistor 330a and the first NMOS transistor 330b also receive the input signal 325. A drain of the first NMOS transistor 330b and a drain of the blocking PMOS transistor 330c are interconnected to generate the first inverter output 365. The inverter type level shifter 300 further includes a second inverter 340. The second inverter 340 includes a second PMOS transistor 340a having a gate coupled to a gate of a second NMOS transistor 340b. The second inverter 340 is coupled to the first inverter output 365 and operates on the second power supply voltage (VDD2) 310 and the ground voltage (VSS) 315; to generate an output signal 335.

The operation of the level shifter 300 in FIG. 3 is now explained. The level shifter 300 receives the input signal 325 to generate the output signal 335 with a voltage level according to the level of the input signal 325. The input signal operates between the first power supply voltage (VDD1) 305 and the ground voltage (VSS) 315, and the output signal 335 operates between the second power supply voltage (VDD2) 310 and the ground voltage (VSS) 315. Consider a situation when the input signal 325 is logic '0'. The first PMOS transistor 330a and the blocking PMOS transistor 330c pass the first power supply voltage (VDD1) 305 to the first inverter output 365. If the first power supply voltage (VDD1) 305 is lesser in value compared to the second power supply voltage (VDD2) 310, then the second power supply voltage (VDD2) 310 is passed as the output signal 335. If the first power supply voltage (VDD1) 305 is greater in value compared to the second power supply voltage (VDD2) 310, then the ground voltage (VSS) 315 is passed as the output signal 335. Therefore, the voltage level of the output signal 335 depends on the input signal 325.

An ESD pulse effectively results in a sudden rise and fall in the voltage seen in either any one of the first power supply voltage 305, the second power supply voltage 310 and the ground voltage 315. Consider a situation when there is a voltage spike in the second power supply voltage (VDD2) 310. This voltage spike results in the transmission of the second power supply voltage (VDD2) 310 through the second PMOS transistor 340a to the first inverter output 365. Following the voltage spike, the blocking PMOS transistor (330c) provides the required blocking (additional voltage drop in the path) and thus increases the damage threshold of the gate oxide of the PMOS transistor (340a) in the second inverter. Therefore, the blocking PMOS transistor 330c increases electro-static discharge (ESD) protection robustness to the second inverter 340. The proposed level shifter 300 does not require high resistance clamps or resistors (Rcdm) 145 to protect the transistor 340a. The high resistance clamps or resistor (Rcdm) 145 are not desirable in high speed applications (like USB 3.0, Thunder Bolt etc) as it adversely affects the robustness of the circuit. With the level shifter 300 there is no loss of functionality of the IC as the proposed solution provides high resistance in a very small area.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic state "1," and the term "low" is generally intended to describe a signal that is at logic state "0." The term "on" applied to a transistor or group of transistors is generally intended to describe gate biasing to enable current flow through the transistor or transistors.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An inverter type level shifter comprising:
a first power supply voltage and a first ground voltage;
a first inverter operating on the first power supply voltage and the first ground voltage to generate a first inverter output in response to an input signal, the first inverter comprising:
a first PMOS transistor having a drain coupled to a source of a blocking PMOS transistor; and
a first NMOS transistor having a drain coupled to a source of a blocking NMOS transistor; wherein a drain of the blocking NMOS transistor and a drain of the blocking PMOS transistor are interconnected to generate the first inverter output;
a second power supply voltage and a second ground voltage; and
a second inverter coupled to the first inverter output and operating on the second power supply voltage and the second ground voltage to generate an output signal; wherein the blocking PMOS transistor provides the additional blocking on an event of a voltage spike in the second power supply voltage with respect to the first power supply voltage, and the blocking NMOS transistor provides the additional blocking on an event of a voltage spike in the second ground domain with respect to the first ground domain, to increase electro-static discharge (ESD) protection robustness to the second inverter, and wherein a bulk terminal of the blocking PMOS transistor is connected to the drain of the blocking PMOS transistor such that the blocking PMOS transistor provides the additional voltage drop in the path on the event of the voltage spike in the second power supply voltage with respect to the first power supply voltage.

2. The inverter type level shifter of claim 1, wherein a bulk terminal and drain of the blocking NMOS transistor are interconnected such that the blocking NMOS transistor provides the additional voltage drop in the path on the event of the voltage spike in the second ground voltage with respect to the first ground voltage.

3. The inverter type level shifter of claim 2, wherein the blocking NMOS transistor increases the damage threshold of the gate oxide of the NMOS transistor in the second inverter.

4. The inverter type level shifter of claim 1, wherein gates of the first PMOS transistor, blocking PMOS transistor, blocking NMOS transistor and the first NMOS transistor are interconnected and are configured to receive the input signal.

5. The inverter type level shifter of claim 1, wherein the second inverter comprises a second PMOS transistor coupled to a second NMOS transistor.

6. The inverter type level shifter of claim 1 receives the input signal to generate the output signal with a voltage level according to the level of the input signal, wherein the input signal operates between the first power supply voltage and the first ground voltage, and the output signal operates between the second power supply voltage and the second ground voltage.

7. The inverter type level shifter of claim 1, wherein the blocking PMOS and blocking NMOS are implemented as equivalent diode to provide ESD robustness.

8. An inverter type level shifter comprising:
a first power supply voltage, a second power supply voltage and a ground voltage;
a first inverter operating on the first power supply voltage and the ground voltage to generate a first inverter output in response to an input signal; the first inverter comprising:
 a first PMOS transistor having a drain coupled to a source of a blocking PMOS transistor; and
 a first NMOS transistor having a drain coupled to a drain of the blocking PMOS transistor to generate the first inverter output; and
a second inverter coupled to the first inverter output and operating on the second power supply voltage and the ground voltage; to generate an output signal; wherein the blocking PMOS provides the required blocking on the event of the voltage spike in the second power supply voltage with respect to the first power supply voltage, to increase electro-static discharge (ESD) protection robustness of the second inverter, and wherein a bulk terminal and the drain of the blocking PMOS transistor are interconnected, such that the blocking PMOS provides the required blocking on the event of the voltage spike in the second power supply voltage with respect to the first power supply voltage.

9. The inverter type level shifter of claim 8, wherein gates of the first PMOS transistor, the first NMOS transistor and the blocking PMOS transistor are interconnected and are configured to receive the input signal.

10. The inverter type level shifter of claim 8, wherein the second inverter comprises a second PMOS transistor coupled to a second NMOS transistor.

11. The inverter type level shifter of claim 8 receives the input signal to generate the output signal with a voltage level according to the level of the input signal, wherein the input signal operates between the first power supply voltage and the ground voltage, and the output signal operates between the second power supply voltage and the ground voltage.

12. The inverter type level shifter of claim 8, wherein the blocking PMOS is implemented as equivalent diode to provide ESD robustness.

* * * * *